United States Patent [19]
Arakawa et al.

[11] Patent Number: 4,711,548
[45] Date of Patent: Dec. 8, 1987

[54] ASSEMBLY STRUCTURE OF PRINTED CIRCUIT BOARDS FOR CAMERA

[75] Inventors: Kazuhiko Arakawa, Tokyo; Jun Terashima; Go Tokura, both of Kanagawa, all of Japan

[73] Assignee: Canon Kabushiki Kaisha, Tokyo, Japan

[21] Appl. No.: 938,998

[22] Filed: Dec. 8, 1986

[30] Foreign Application Priority Data

Dec. 14, 1985 [JP]   Japan .................................. 60-281539
Dec. 14, 1985 [JP]   Japan .................................. 60-281540

[51] Int. Cl.⁴ ............................................... G03B 7/00
[52] U.S. Cl. ....................................... 354/485; 439/66; 439/67
[58] Field of Search .............. 354/485, 288; 339/17 F, 339/176 MF

[56] References Cited

U.S. PATENT DOCUMENTS 4,359,277  11/1982  Shimizu et al. .................. 354/485 X
4,538,865  9/1985   Wakabayashi et al. ........... 339/17 F Primary Examiner—L. T. Hix
Assistant Examiner—Brian W. Brown
Attorney, Agent, or Firm—Fitzpatrick, Cella, Harper & Scinto

[57] ABSTRACT

The present invention relates to a camera having circuit elements arranged by using flexible printed circuit boards. In particular, three or more flexible printed circuit boards on respective different faces of a framework of the camera are provided each with an extension bent to common face contiguous to but oriented at right angles with the board bearing faces. The bent extensions are superimposed one upon another when the electrical connection of all the printed circuit boards is established in one step of assembling operation.

10 Claims, 14 Drawing Figures

ASSEMBLY STRUCTURE OF PRINTED CIRCUIT BOARDS FOR CAMERA

BACKGROUND OF THE INVENTION

1. Field of the Invention

This invention relates to cameras, and more particularly to the structure of assembly of flexible printed circuit boards within the camera housing.

2. Description of the Related Art

For the efficient utilization of the narrow space within the housing of the camera, particularly single lens reflex one, the wires of electrical circuitry were installed in the flexible printed circuit board. And, this board was only one in number, and took its place on the top face of the camera framework or aluminium die-cast body.

Recently, however, as the rate of using electronics and the number of capabilities are increased, the scale of necessary electrical circuits is increasing and the necessity of spreading many switchings and sensors over the various portions of the interior of the camera is encountered. Therefore, the printed circuit board must be extended from the top face of the framework to the side faces and even to the bottom.

For this case, if all the extended portions of the printed circuit boards are constructed in the unbroken form to that part of the board which lies on the top face of the framework, it is at the initial stage of assembling operation that the expanded printed circuit board of very large size is treated while its extensions are bent successively in conformance with the top, side and bottom faces of the framework. Such an installation has had a very low efficiency, giving large limitations on the assembly line and production cost.

To avoid this, the flexible printed circuit board may be divided into a plurality of corresponding parts to the top, sides and bottom of the framework, and, after these separate parts have been installed on the respective faces of the framework, any adjacent two of the parts are electrically connected with each other to establish a series of continuous wires over the entire electrical circuit system.

FIG. 13 shows an example of this conventional method. The flexible printed circuit board is divided into three separate parts, of which the first 1 is to be put on the top of the framework with its central part bent to conform with the roofs of the pentagonal prism, the second 2 is to be carried on the bottom, and the third 3 is to be positioned on the right hand side. Then, these parts 1, 2 and 3 are fixedly secured to the respective faces of the framework. Then, the first and third parts 1 and 3 are electrically connected to each other at their overlapped end portions 1a and 3a above the top face of the framework, and the second and third parts 2 and 3 are electrically connected to each other at their overlapped end portions 2a and 3a below the bottom of the framework. Thus, the flexible printed circuit board as a whole is regained in assembly on the framework.

This structure of construction of the multidivision flexible printed circuit board usually requires the use of at least two pairs of connectors, in the aforesaid example, 1a-and-3a and 2a-and-3b, of different wiring pattern at different places from each other. Moreover, regardless of whether solder or pressure sensitive electrically conductive rubber is in use, additional means must be provided for locating the ends of the two separate parts of the board in each pair in fixedly secured relation to the framework. Therefore, the problems of worsening the efficiency of the assembly line and producing no advantage on the cost are left unsolved. Another drawback of the aforesaid prior art is that an interconnection wire pattern that allows for the electrical circuits of the first and second separate parts of the printed circuit board to communicate with each other in some portions must be formed on the third part. This results in a decrease of the density of electrical circuits to be assigned to the third separate part of the printed circuit board.

SUMMARY OF THE INVENTION

The present invention has similar concerns with the multiple divided form of the flexible printed circuit board for installation on the various faces of the framework of the camera.

It is, therefore, an object of the invention to provide a structure of assembly of the flexible printed circuit board which has eliminated all the above-described problems.

In an embodiment of the invention, the flexible printed circuit board is divided into a plurality of separate parts to be installed on the top, bottom and side or sides of the framework of the camera, whereby these parts each are provided with an extended portion of such length that when it is bent to parallelism with that common face of the framework which bears no separate part of the printed circuit board, all the extended portions will be superimposed one upon another to permit electrical connections between the lead wires of the circuits formed on the extended portions. Thus, the entirety of the flexible printed circuit board is regained from its separate parts under the condition that all the circuit portions in the separate parts are connected with each other.

Another object of the present invention is to provide a printed circuit board for installation in a camera which enables manually operating means for finely adjusting or checking circuit elements such as variable resistors, trimmer condensers, etc. to be positioned in right places with advantages of improving the density of assembly of circuit elements, and decreasing the difficulty of adjusting and checking operations.

Other objects of the present invention will become apparent from the following description of embodiments thereof taken in conjunctioin with the drawings.

DETAILED DESCRIPTION OF THE PREFERRED EMBODIMENTS

Figure 1:
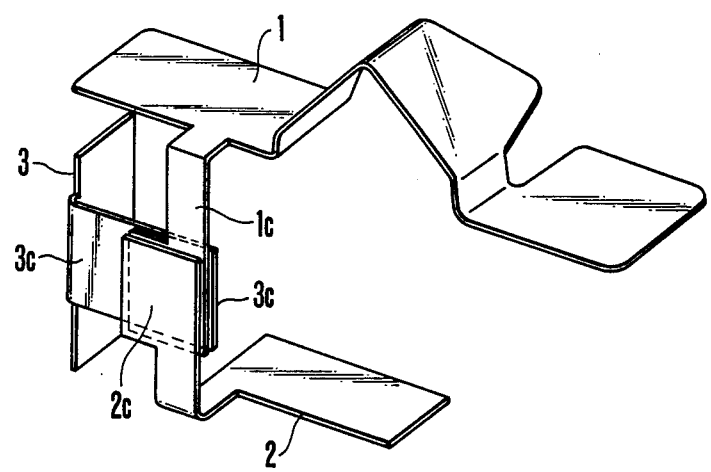
FIG. 1 is a perspective view of an example of layout of a plurality of flexible printed circuit board elements installed on a camera framework according to the present invention.

FIG. 1 illustrates an embodiment of the flexible printed circuit board for installation in the camera according to the present invention.

A flexible printed circuit board is divided into three separate parts 1 to 3, of which the first 1 is to be installed on the top face of a framework (not shown) of the camera with its central portion carrying a roof type pentagonal prism, the second 2 is to be installed below the bottom face, and the third 3 is to be installed on the right hand side. The flexible printed circuit board is constructed with a substrate of polyimido or other electrically insulating material, on either one or both of the surfaces of which desired electrically conductive (copper) patterns (not shown) are formed. Electrical circuit elements (not shown) are mounted on the patterns.

The aforesaid first to third separate parts 1 to 3 of the flexible printed circuit board are provided with respective extended portions 1c, 2c and 3c which are bent to parallelism with the front face of the framework so that only means suffices for fixedly securing all the board elements 1 to 3 to the framework. As the electrical circuits on the board elements 1 to 3 have their lead wires in the extended portions 1c to 3c, such means also serve to establish the entirety of electrical circuit over the first to third board elements.

An example of this connecting means for the ends of the extended portions 1c to 3c on the front face of the framework is shown in FIGS. 2 to 4(b).

Figure 2:
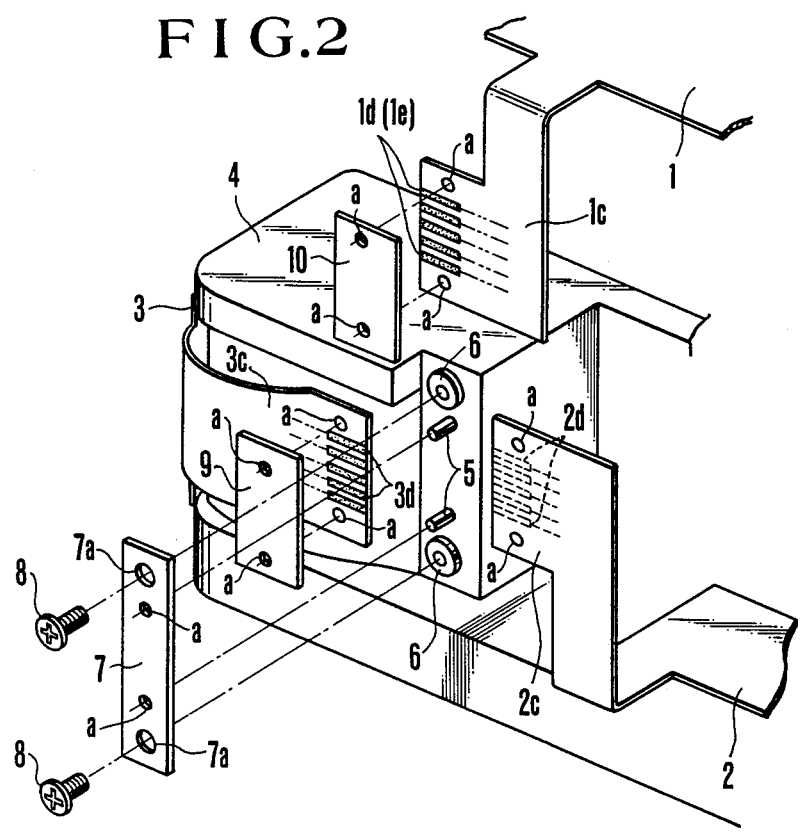
FIG. 2 is an exploded perspective view of the connected portion of the elements of FIG. 1.

In FIG. 2, the framework 4 has a pair of location pins 5 fixedly mounted in a prescribed vertical line on the front face thereof. On either outer side of the pins 5 there are screw-threaded bosses 6. A rigid pressor plate 7 of steel is pressed by screw fasteners 8 engaging in the respective bosses 6 against first and second rubber connectors 9 and 10 between the extensions 1c and 3c, and 1c and 2c respectively, while the location pins 5 fit in holes "a" of the extensions 1c to 3c, the rubber connectors 9 and 10, and the pressor plate 7.

1d and 1e are rows of electrically conductive lead patterns on the front and rear surfaces of the extension 1c of the first printed circuit board element 1 respectively.

2d is a row of electrically conductive lead patterns on the rear surface of the extension 2c of the second printed circuit board element 2 in correspondence with the row of lead patterns 1d.

3d is a row of electrically conductive lead patterns on the front surface of the extensions 3c of the third printed circuit board element 3 in correspondence with the row of lead patterns 1e.

The rubber connector 9(10) has elasticity in the direction of thickness, and when pressed to this direction gets an electrical conductivity only in that direction, while holding the electrical insulation in the other directions. In one type of such rubber connector shown in FIG. 4(a), electrically conductive filaments 9b such as those of metal or carbon are collimated in the direction of thickness when they are buried in silicon rubber or other elastic insulation base 9a. In another type shown in FIG. 4(b), silicon rubber layers 9a and carbon-impregnated layers 9b are laminated alternatively in the direction perpendicular to the thickness.

When to install the flexible printed circuit board on the framework of the camera, its third element 3 is first put on the right hand side of the framework 4, while the holes "a" are in engagement on the location pins 5. Then, in a similar manner, the first rubber connector 9, the end of the extended portion 1c of the first board element 1, the second rubber connector 10, the end of the extended portion 2c the second board element 2, and the pressor plate 7 are assembled successively in this order. Therefore, the parts 3c, 9, 1c, 10, 2c and 7 are superimposed one on the other in this order in accurately adjusted relative positions.

Then, the fasteners 8 are inserted through all the holes 7a into the bosses 6, and turned to tighten the pressure plate 7 so strongly that the superimposed parts 3c, 9, 1c, 10 and 2c between the pressor plate 7 and the front face of the framework 4 are held in compressed states relative to each other.

In the case of this example, the height of projection of the boss 6 (see FIG. 3) is previously determined to be far shorter than the overall thickness of the superimposed parts 3c, 9, 1c, 10 and 2c when no pressure is applied thereto, but to be so long that the fastener 8 can be screwed in the boss 6 until the back surface of the pressure plate 7 is firmly received on the top of the boss 6.

Figure 3:
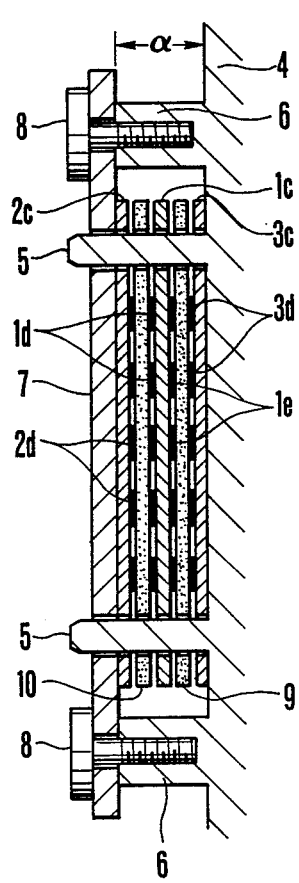
FIG. 3 is a sectional view in enlarged scale of the connected portions.

FIG. 3 shows the fully screwed-in state of the fastener 8. For the purpose of convenience, the electrically conductive lead pattern is more exaggerated in thickness than in length.

Since, in this state, the leads in the array 3d on the front surface of the extension 3c of the third printed circuit board element 3 are aligned with the respective leads in the array 1e on the rear surface of the extension 1c of the first printed circuit board element 1 through the first rubber connector 9, because the rubber connector 9 under the pressure is electrically conductive in the direction of thickness, the electrical connection is established between the lead arrays 3d and 1e. From the similar reason, the lead array 2d on the rear surface of the extension 2c is electrically connected with the lead array 1d on the front surface of the extension 1c through the second rubber connector 10.

That is, all the electrical circuits of the first to the third printed circuit board elements 1 to 3 are connected to one another by the above-described connecting portions at only one place.

Figure 5:
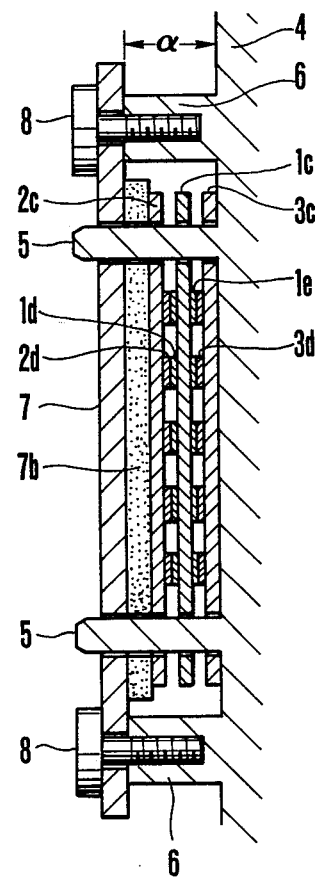
FIG. 5 is a sectional view in enlarged scale of another arrangement of the connected portions.

A variation of the above-described embodiment may be made by omitting the first and second rubber connectors 9 and 10 as shown in FIG. 5. In this case, the lead array 3d contacts directly with the lead array 1e, and the lead array 2d directly with the lead array 1d. The space resulting from the removal of the rubber connectors 9 and 10 is filled with a silicon rubber sponge or other suitable elastic member 7b.

For note, the order of superimposition of the extensions 1c to 3c at the locations pins 5 is not confined to the illustrated embodiment where it is 3c→1c→2c. This order may be altered to suit to the flow of steps in the assembly line, and the order in which the board elements 1 to 3 are connected to each other successively.

Figure 6:
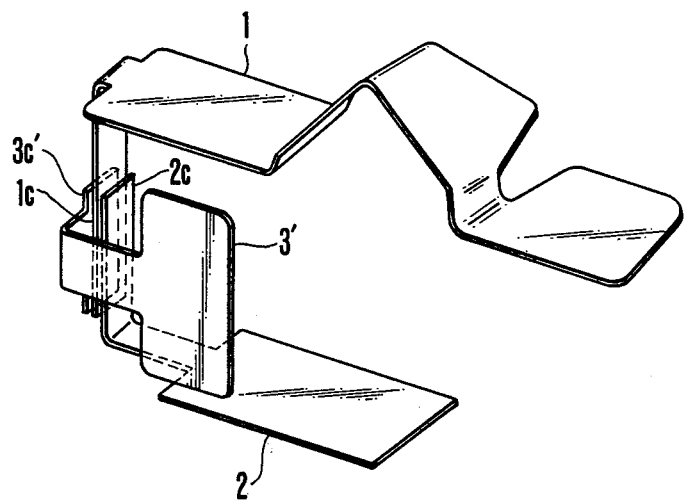
FIG. 6 is a layout diagram of another structure of assembly of plurality of separate parts of a flexible printed circuit board.

FIG. 6 illustrates another example of layout for the installation of the flexible printed circuit board. In this example, the third printed circuit board element 3' is installed on the front face of the framework 4. The extensions 1c, 2c and 3'c are, therefore, directed to the right hand side of the framework 4, and superimposed in the order of 2c→1c→3'c. By using a similar connecting means to that shown in connection with the first example in FIGS. 2 and 3 or 5, the assembly of the three board elements 1 to 3' are fixedly secured to the framework 4 and electrically connected to one another.

Figure 7:
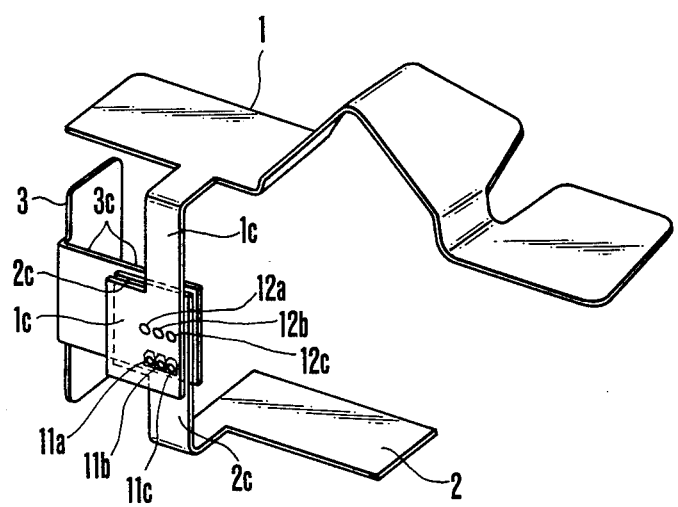
FIG. 7 is a layout diagram of another example of the structure of assembly of a plurality of separate parts of a flexible printed circuit board for installation in the camera according to the present invention.

FIG. 7 is a layout view of an example of the structure of assembly of the separate parts of a flexible printed circuit board illustrating another embodiment of the invention, where the same constituent parts as those in FIG. 1 are denotd by the same reference characters.

In this example, the extended portion 1c of the first flexible printed circuit board element 1 is made to be superimposed in the outermost position. This permits its front surface to be used for concentrically arranging circuit adjusting and checking members 11 and 12 for variable resistors and trimmer condensers (not shown). In this point, the embodiment of FIG. 7 differs from the embodiment of FIG. 1.

Figure 8:
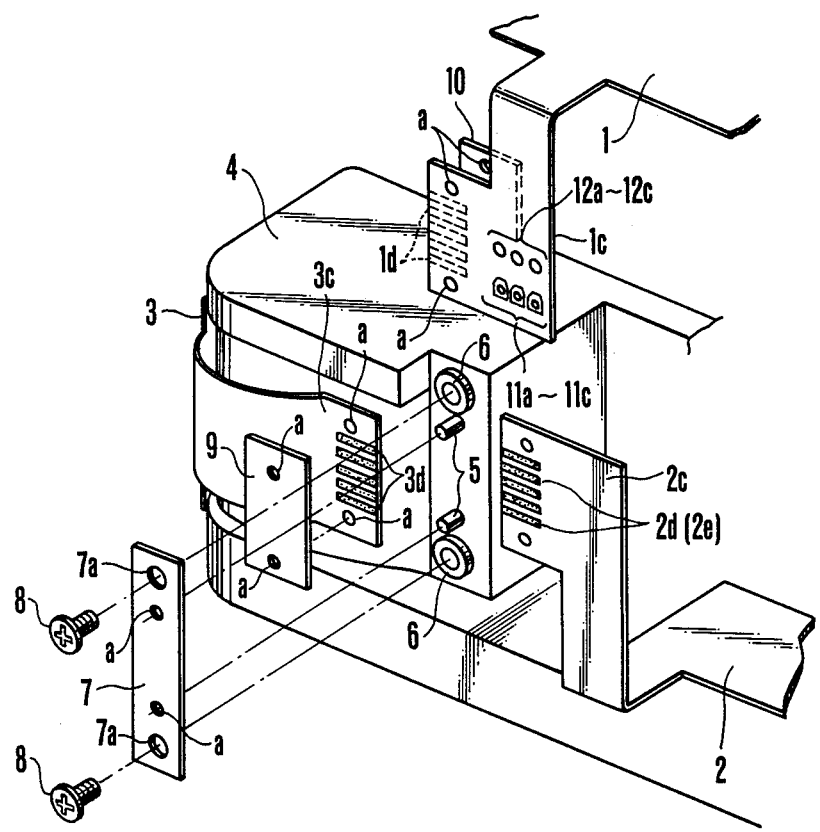
FIG. 8 is an exploded perspective view of the connected portions of the separate parts of the board.
Figure 9:
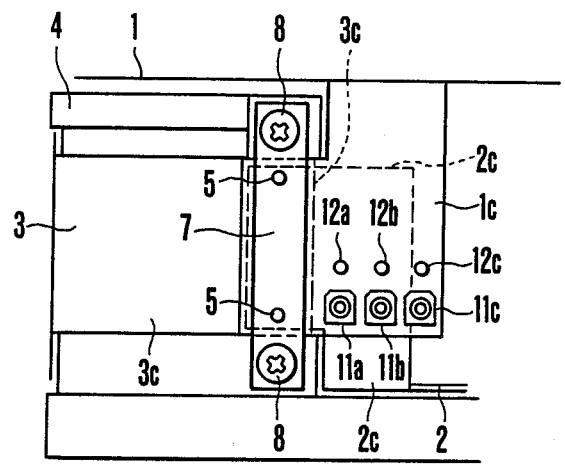
FIG. 9 is an elevational view of the connected portions of FIG. 8.
Figure 10:
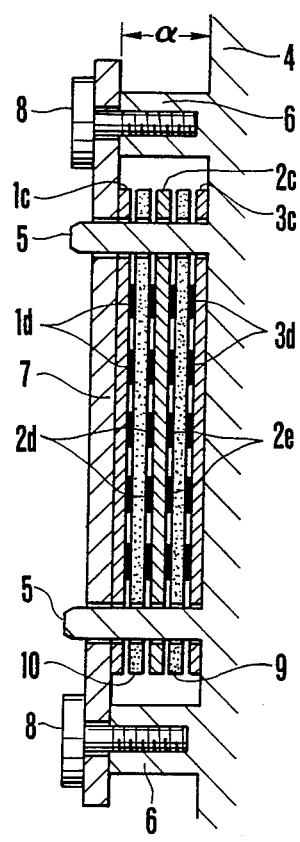
FIG. 10 is a sectional view in enlarged scale of the connected portions of FIG. 8.

FIGS. 8 to 10 illustrate an example of the connecting and fixedly securing means for the ends of the extended portions 1c, 2c, and 3'c of all the three flexible printed circuit board elements 1, 2 and 3' on the front face of the framework of the camera.

FIG. 8 is an exploded perspective view of the connecting portions, and FIG. 9 is an elevational view. In this figures, 4 is a framework of the camera; 5, 5 are a pair of location pins planted in a vertical line on the front face of the framework 4 in prescribed positions; 6, 6 are a pair of screw-threaded hole-equipped bosses provided on the outer sides of the pair of location pins 5; 7 is a pressure plate made of steel; 8, 8 are screw fasteners for the pressor plate 7; 9, 10 are first and second rubber connectors.

The extended portions 1c, 2c and 3c of the first to the third flexible printed circuit board elements 1, 2 and 3, the aforesaid first and second rubber connectors 9 and 10, and the pressor plate 7 each have a pair of small holes "a" to be fitted on the pair of locations pins 5, 5. The above-described configuration is the same as that of the above-described embodiment of FIG. 2.

1d is an array of electrically conductive lead patterns provided on the rear surface of the end of the extended portion 1c of the first flexible printed circuit board element 1.

2d, 2e are arrays of electrically conductive lead patterns provided on the front and rear surfaces of the end of the extended portion 2c of the second flexible printed circuit board element 2. The array of lead patterns 2d is in correspondence with the array of lead pattern 1d on the rear surface of the end of the extended portion 1c of the first flexible printed circuit board 1.

3d is an array of electrically conductive lead patterns provided on the front surface of the end of the extended portion of the third printed circuit board element in correspondence with the array of electrically conductive patterns on the rear surface of the end of the extended portion of the second printed circuit board element 2.

Figures 4A, 4B:
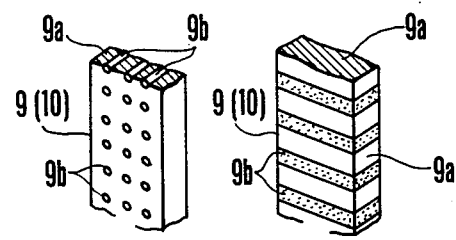
FIGS. 4(a) and 4(b) are fragmentary perspective views of the models of structure of rubber connectors.

The rubber connector 9(10) has elasticity in the direction of thickness, and when pressed in the direction of thickness, gets electrical conductivity only in the direction of thickness, while holding the electrical insulation in the other directions. Two types of rubber connectors shown in FIGS. 4(a) and 4(b) are available.

Now, to the pair of location pins 5, 5 in the vertical line on the front face of the framework 4, the small holes "a" formed on the end of the extended portion 3c of the third printed circuit board element 3 are first fitted so that the board element 3 is fixedly secured to the framework 4. In a similar manner, the first rubber connector 9→the end of the extended portion 2c of the second printed circuit board element 2 →the second rubber connector 10→the end of the extended portion 1c of the first printed circuit board element 1 →the pressor plate 7 are fitted with their small holes "a" on the location pins 5, 5 so that the aforesaid parts 3c, 9,2c, 10, 1c and 7 are superimposed successively in that order.

Then, the screw fasteners 8, 8 are inserted into the respective holes 7a, 7of the pressor plate 7 and therefrom through all the holes "a" into the screw-threaded holes of the bosses 6, 6. By sufficiently tightening the pressor plate 7 against the front face of the framework 4, the superimposed parts 3c, 9, 2c, 10 and 1c between the pressor plate 7 and the front face of the framework 4 are held in the compressed states relative to each other.

In the case of this example also, similarly to the example shown in FIG. 3, the height $\alpha$ of the projection of the boss 6 is previously determined to be far shorter than the overall thickness of the superimposed parts 3c, 9, 2c, 10 and 1c (see FIG. 10) when no pressure is applied thereto. By fully turning the screw fasteners 8, 8 until the rear surface of the pressor plate 7 is received on the top of the bosses 6, 6, the aforesaid superimposed parts 3c, 9, 2c, 10 and 1c are compressed between the pressor plate 7 and the front face of the framework 4.

In this state, the electrically conductive lead pattern array 3d on the front surface of the end of the extended portion 3c of the third printed circuit board 3 is aligned with the electrically conductive lead pattern array 2e on the rear surface of the end of the extended portion 2c of the second printed circuit board element 2 across the first rubber connector 9 so that when the first rubber connector 9 becomes electrically conductive in the direction of thickness under the pressure, the electrically conductive lead pattern arrays 3d and 3e are electrically connected to each other in lead-to-lead relation. Also, similarly, the electrically conductive lead pattern array 2d on the front surface of the end of the extended portion 2c of the second printed circuit board element 2 is aglined with the electrically conductive lead pattern array 1d on the rear surface of the end of the extended portion 1c of the first printed circuit board element 1 across the second rubber connector 10 so that when the second rubber connector 10 becomes electrically conductive in the direction of thickness under the pressure, both arrays 2d and 1d are electrically connected with each other in lead-to-lead relation through the second rubber connector 10 which is now made electrically conductive in the direction of thickness under the pressure.

That is, similarly to the case of FIG. 3, the electrical circuits in the assembly of the first to third flexible printed circuit board elements 1 to 3 are all connected directly to each other at the aforesaid only one place to obtain the entirety of the series of wirings.

Figure 11:
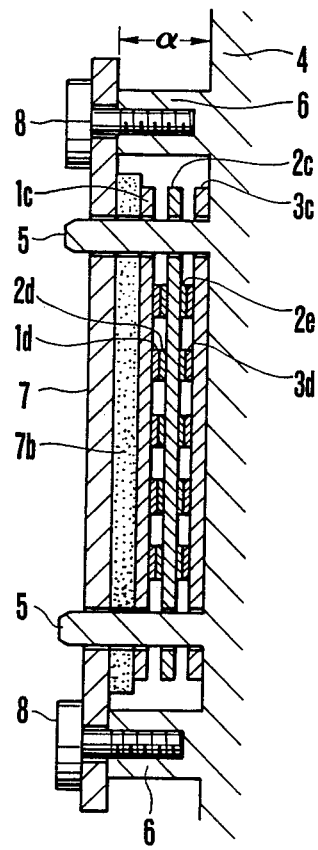
FIG. 11 is a sectional view in enlarged scale of another arrangement of the connected portions.

The first and second rubber connectors 9 and 10 may be omitted as in an example shown in FIG. 11. So, the lead arrays 2d and 2e of the second board element 2 are in direct contact with the lead arrays 1d and 3d of the first and third board elements 1 and 3, respectively. Then, an elastic filler 7b of silicon rubber sponge or the like is used as intervening between the back surface of the pressor plate 7 and the front surface of the end of the extension 1c.

Figure 12:
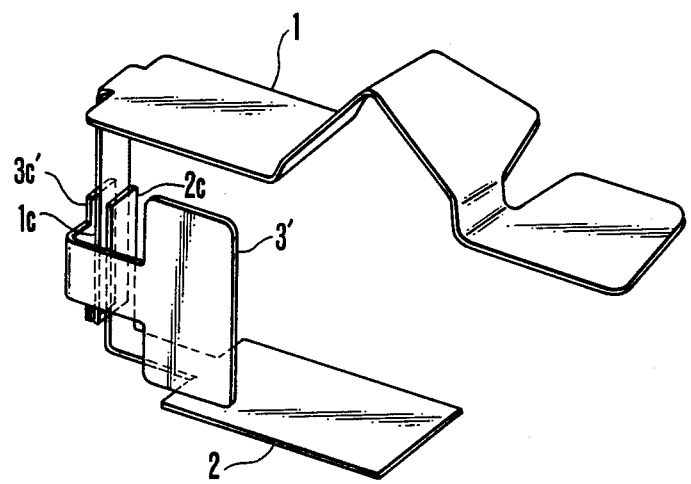
FIG. 12 is a layout view of another structure of assembly of the separate parts of a flexible printed circuit board.

FIG. 12 is a view of the layout of another example of the structure of a flexible printed circuit board element assembly. This example comprises a first flexible printed circuit board element 1 to be installed on the top face of the framework of the camera over the pentagonal prism portion, a second flexible printed circuit board element 2 to be installed below the bottom face of the framework, and a third flexible printed circuit board element 3' to be installed on the front face of the framework laterally near the lens mount portion. These three board elements 1 to 3' are provided with respective extended portions 1c, 2c, and 3'c are bent to parallelism with a common face, in this instance, the right hand side, of the framework to allow for only one connecting means of similar structure to that described in connection with FIGS. 7, 8 or 9, or other suitable connecting means to fixedly secure all the three extended portions 1c, 2c, and 3'c to the framework along with the electrical connection therebetween.

In this case, too, all the necessary adjusting and checking members for the electrical circuit elements such as those indicated at 11a to 11c and 12a to 12c are concentrically gathered on the outermost one of the superimposed extensions 1c, and 2c and 3'c.

As has been described above, according to the present invention, only one connector suffices for not only installing the assembly of a plurality of, in the illustrated embodiments, three, flexible printed circuit board elements in fixedly secured relation on the framework of the camera, but also establishing the entirety of electrical circuitry over all the board elements. This produces advantages of improving the efficiency of work on the assembly line and reducing the space the board element assembly occupies.

Another advantage is that because only one bend is sufficient to each of the extended portions of the flexible printed circuit board elements, the length of the extended portion can be minimized. This leads to a cost down as a lot of substrata for the board elements are punched out of a sheet, when the discarded parts are reduced in area.

Figure 13:
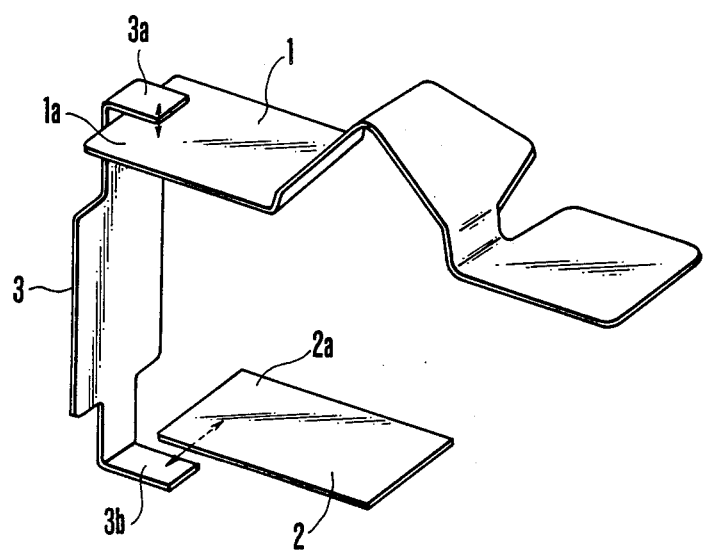
FIG. 13 is a layout view of the prior known structure of assembly of the divided flexible printed circuit board.

Moreover, the necessity of using any one of the three printed circuit board elements for communication between the other two as in the prior art shown in FIG. 13 can be removed, thereby giving an additional advantage that unduly long wirings become unnecessary, and the density of electrical circuits on each of the board elements is increased.

Further, because all the board elements have a common center at the superimposed extensions thereof, all the adjusting and checking means for the circuit elements can take their place in that center. This makes it possible to perform the adjusting and checking operations quickly and easily. This feature also facilitates a further improvement of the density of electrical circuits.

What is claimed is:

1. A camera having electrical circuits arranged on an assembly of flexible printed circuit boards, comprising:
  (a) a first flexible printed circuit board arranged on a first face of a framework of said camera, said board having an extension bent to the direction of a second face of said framework;
  (b) a second flexible printed circuit board arranged on a third face of said framework, said board having an extension bent to the direction of said second face; and
  (c) a third flexible printed circuit board arranged on a fourth face of said framework, said board having an extension bent to the direction of said second face, whereby said extensions each are provided with a conductor for electrical connection, and all said bent-off portions are superimposed one upon another and on said second face so that the wires of any adjacent two of said printed circuit boards are electrically connected to each other at said connectors.

2. A camera according to claim 1, further including a pressor member for pressing said superimposed bent-off portions against said second face of said framework.

3. A camera according to claim 1, further including a pair of pins fixedly mounted on said second face, and a retaining member having holes fitted on said pins, and wherein said bent-off portions of said extensions each are proided with a pair of holes fitted on said pins, whereby all said printed circuit boards are assembled with their holes being fitted on said pins successively, and then said retaining member with its holes being fitted on said pin sandwiches said superimposed bent-off portions in between it and said second face.

4. A camera according to claim 3, further including an electrically conductive connector positioned between the successive two of said bent-off portions of said extensions, an wherein said conductors on said bent-off portions of said extensions are connected through said connector.

5. A camera according to claim 1, wherein said first, said second, said third, and said fourth faces of said framework are respectively the top, front, right or left hand side, and bottom faces thereof.

6. A camera according to claim 1, wherein said first, said second, said third and said fourth faces of said framework are respectively the top, right or left hand side, front and bottom faces thereof.

7. A camera according to claim 1, wherein the outer surface of the farthest one of said superimposed bent-off portions of said extensions from said second face is used for installation of circuit members.

8. A camera according to claim 7, wherein said circuit members are members for checking the circuit.

9. A camera according to claim 7, wherein said circuit members are pads for checking the circuit.

10. A camera having electrical circuits arranged on an assembly of flexible printed circuit boards, comprising:
  (a) a first flexible printed circuit board arranged on a first face of a framework of said camera, said board having an extension bent to the direction of a second face of said framework;
  (b) a second flexible printed circuit board arranged on a third face of said framework, said board having an extension bent to the direction of said second face; and
  (c) a third flexible printed circuit board arranged on a fourth face of said framework, said board having an extension bent to the direction of said second face, whereby said extensions each are provided with a conductor for electrical connection, and all said bent-off portions are superimposed one upon another and on said second face so that the wires of any adjacent two of said printed circuit boards are electrically connected to each other at said connectors, each of said extensions being provided with a conductor for connection;

(d) a location pin fixedly mounted on said second face, and on which a hole provided in each of said bent-off portions of said extensions is fitted so that when all said bent-off portions are superimposed one upon another, the positions of said conductors on the confronting surfaces of the successive two of said bent-off portions of said extensions are determined to register with each other; and (e) a pressor member for pressing said superimposed bent-off portions of said extensions against said second face.

* * * * *

UNITED STATES PATENT AND TRADEMARK OFFICE
CERTIFICATE OF CORRECTION

PATENT NO. : 4,711,548　　　　　　　　　　　Page 1 of 4

DATED : December 8, 1987

INVENTOR(S) : KAZUHIKO ARAKAWA ET AL.

It is certified that error appears in the above-identified patent and that said Letters Patent is hereby corrected as shown below:

COLUMN 1:

Line 16, "aluminium" should read --aluminum--;
    Line 21, "switchings" should read --switches--; and
    Line 59, "regained in assembly" should read --reassembled--.

COLUMN 2:

Line 63, "of plurality" should read --of a plurality--.

COLUMN 3:

Line 36, "only means" should read --only one means--;
    Line 48, "pressor" should read --pressure--;
    Line 54, "pressor" should read --pressure--; and
    Line 64, "extensions 3c" should read --extension 3c--.

UNITED STATES PATENT AND TRADEMARK OFFICE
CERTIFICATE OF CORRECTION

PATENT NO. : 4,711,548

DATED : December 8, 1987

INVENTOR(S) : KAZUHIKO ARAKAWA ET AL.

It is certified that error appears in the above-identified patent and that said Letters Patent is hereby corrected as shown below:

COLUMN 4:

Line 11, "to install" should read --installing--;
Line 18, "2c the" should read --2c of the--;
Line 19, "pressor" should read --pressure--;
Line 26, "pressor" should read --pressure--; and
Line 29, "height of" should read --height $\lambda$ of--;.

COLUMN 5:

Line 19, "denotd" should read --denoted--;
Line 30, "3'c" should read --3c--;
Line 35, "this" should read --these--;
Line 41, "pressor" should read --pressure--;
Line 46, "pressor" should read --pressure--; and
Line 64, "portion of" should read --portion 3 of--.

COLUMN 6:

Line 17, "pressor" should read --pressure--;
Line 18, "9,2c," should read --9, 2c,--;
Line 21, "7of the pressor" should read --7 of the pressure--;
Line 24, "pressor" should read --pressure--;
Line 26, "pressor" should read --pressure--;

UNITED STATES PATENT AND TRADEMARK OFFICE
CERTIFICATE OF CORRECTION

PATENT NO. : 4,711,548
DATED : December 8, 1987
INVENTOR(S) : KAZUHIKO ARAKAWA ET AL.

Page 3 of 4

It is certified that error appears in the above-identified patent and that said Letters Patent is hereby corrected as shown below:

COLUMN 6: (cont.)

Line 35, "pressor" should read --pressure--;
    Line 38, "pressor" should read --pressure--;
    Line 48, "3e" should read --2e--; and
    Line 53, "aglined" should read --aligned--.

COLUMN 7:

Line 8, "pressor" should read --pressure--;
    Line 33, "and" (first occurrence) should be deleted; and
    Line 48, "down" should read --reduction--.

COLUMN 8:

Line 20, "pressor" should read --pressure--;
    Line 26, "proided" should read --provided--; and
    Line 35, "an" should read --and--.

UNITED STATES PATENT AND TRADEMARK OFFICE
CERTIFICATE OF CORRECTION

PATENT NO. : 4,711,548
DATED : December 8, 1987
INVENTOR(S) : Kazuhiko Arakawa et al Page 4 of 4

It is certified that error appears in the above-identified patent and that said Letters Patent is hereby corrected as shown below:

COLUMN 10:

Line 6, "pressor" should read -- pressure --.

Signed and Sealed this

Second Day of August, 1988

Attest:

DONALD J. QUIGG

Attesting Officer

Commissioner of Patents and Trademarks